United States Patent [19]
Vo

[11] Patent Number: 5,861,763
[45] Date of Patent: *Jan. 19, 1999

[54] THRESHOLD VOLTAGE SCALABLE BUFFER WITH REFERENCE LEVEL

[75] Inventor: Huy Thanh Vo, Boise, Id.

[73] Assignee: Micron Technology, Inc., Boise, Id.

[ * ] Notice: The term of this patent shall not extend beyond the expiration date of Pat. No. 5,703,500.

[21] Appl. No.: 918,623

[22] Filed: Aug. 22, 1997

Related U.S. Application Data

[63] Continuation of Ser. No. 648,443, May 15, 1996, Pat. No. 5,703,500.

[51] Int. Cl.[6] .............................................. H03K 19/0185
[52] U.S. Cl. ................................. 326/71; 326/81; 326/83
[58] Field of Search ................................. 326/68, 70–71, 326/80–81, 83, 86, 112, 119, 121; 365/189.05; 327/541, 543

[56] References Cited

U.S. PATENT DOCUMENTS

| | | |
|---|---|---|
| 4,672,243 | 6/1987 | Kirsch . |
| 5,150,186 | 9/1992 | Pinney et al. ............................ 357/51 |
| 5,304,867 | 4/1994 | Morris . |
| 5,406,139 | 4/1995 | Sharpe-Geisler ........................ 326/71 |
| 5,465,234 | 11/1995 | Hannai ................................... 365/200 |
| 5,594,361 | 1/1997 | Campbell ............................... 326/24 |
| 5,703,500 | 12/1997 | Vo .......................................... 326/71 |

Primary Examiner—Jon Santamauro
Attorney, Agent, or Firm—Schwegman, Lundberg, Woessner & Kluth, P.A.

[57] ABSTRACT

A buffer circuit (10). The buffer circuit (10) includes a first inverter (12) with a first current limiter (18) that limits the standby current used by the first inverter (12). Further, the buffer circuit (10) includes a second inverter (14) that is coupled to an output of the first inverter (12). The input buffer (10) converts a first logic level of an input signal provided to the first inverter (12) to a second logic level at an output of the second inverter (14). The buffer circuit (10) also includes a second current limiting circuit (16) that is coupled between the first and second inverters (12 and 14) to further limit the standby current in the buffer circuit (10).

13 Claims, 4 Drawing Sheets

THRESHOLD VOLTAGE SCALABLE BUFFER WITH REFERENCE LEVEL

This application is a continuation of U.S. patent application Ser. No. 08/648,443, filed May 15, 1996, now U.S. Pat. No. 5,703,500.

TECHNICAL FIELD OF THE INVENTION

The present invention relates generally to integrated circuits and, in particular, to an input buffer.

BACKGROUND OF THE INVENTION

Electronic systems typically are produced from component parts that are independently designed and manufactured. For example, a typical personal computer includes a microprocessor, some type of memory device such as a dynamic random access memory and a number of other integrated circuits. These components are designed according to standards for various familes of integrated circuits. Integrated circuits in a "family" are designed to recognize defined voltage levels as high and low logic values used by the circuits to communicate and process data. For example, the "transistor-transistor logic" or "TTL" family of integrated circuits typically recognize 0.7 to 0.8 volts as a low logic value and 2.0 to 2.4 volts as a high logic value. In the "complimentary metal-oxide semiconductor" or "CMOS" family, circuits use a voltage that is approximately equal to the power supply as a high logic level and ground potential as the low logic level. During normal operation of the electronic systems, the components communicate with each other to share data and control signals. To do so, the components often need to recognize logic levels for a different family of integrated circuits. Designers have developed various buffer circuits that convert logic levels from a circuit in one family to logic levels of a different family.

One type of buffer circuit converts TTL logic levels for use by a CMOS circuit. The buffer typically consists of two CMOS inverters coupled in series. Unfortunately, this design draws a significant standby current. In an integrated circuit, such as a dynamic random access memory, that has a number of inputs, the standby current could decrease the overall performance of the integrated circuit. With the input buffer in active-standby mode for long periods of time, this problem is exacerbated. Other buffers include schmitt triggers. The schmitt trigger similarly draws a significant standby current.

For the reasons stated above, and for other reasons stated below which will become apparent to those skilled in the art upon reading and understanding the present specification, there is a need in the art for buffer circuit that operates with an insignificant standby current.

SUMMARY OF THE INVENTION

The above-mentioned problems with buffer circuits and other problems are addressed by the present invention which will be understood by reading and studying the following specification. A buffer circuit is described which converts logic levels with reduced standby current.

More particularly, in one embodiment the present invention provides a buffer circuit that includes first and second inverters. The first inverter includes a first current limiter that limits the standby current used by the first inverter. Further, the second inverter is coupled to an output of the first inverter. The input buffer converts a first logic level of an input signal provided to the first inverter to a second logic level at an output of the second inverter. The buffer circuit also includes a second current limiting circuit that is coupled between the first and second inverters to further limit the standby current in the buffer circuit.

In one embodiment, the first current limiting circuit of the buffer circuit comprises a transistor that receives a feedback signal from the output of the second inverter to limit the standby current of the buffer circuit. In another embodiment, the first current limiting circuit of the buffer circuit comprises first and second transistors each having a gate coupled to receive the output signal of the second inverter such that the first transistor limits the standby current of the first inverter when the output of the buffer is a low logic level and the second transistor limits the standby current of the buffer when the output of the buffer is a high logic value.

In one embodiment, the second current limiting circuit of the buffer circuit comprises a current limiting transistor that is controlled by a reference voltage. The current limiting transistor includes a drain that is coupled to the output of the first inverter and the input of the second inverter in a standby current path for the buffer circuit. The reference voltage is coupled to the source of the current limiting transistor. The reference voltage thus establishes a low gate to source voltage for the current limiting transistor so as to limit the standby current of the buffer circuit. In another embodiment, the second current limiting circuit further comprises a voltage generator circuit that generates a reference voltage that is approximately equal to a logic level of the input signal. In another embodiment, the second current limiting circuit further comprises a pass gate transistor that is coupled between the current limiting transistor and the reference voltage. The pass gate transistor passes the reference voltage to the source of the current limiting transistor based on a feedback signal from the output of the second inverter. In another embodiment, the second current limiting circuit further comprises a circuit that delays the feedback signal when turning off the pass gate transistor to improve the stability of the output of the buffer circuit.

In another embodiment, the second current limiting circuit comprises first and second current limiting transistors. The first current limiting transistor is coupled to the output of the first inverter to limit the standby current when a low logic level is applied to the first inverter. Further, the second current limiting transistor is coupled to the output of the first inverter to limit the standby current when a high logic level is applied to the first inverter.

In another embodiment, the present invention provides a memory device that includes a plurality of buffer circuits. The memory device is used in conjunction with an electronic system. The buffer circuits are coupled to receive input signals from the electronic system. Each buffer circuit includes first and second inverters. The inverters are coupled together so as to convert a first logic level of the input signal provided to the first inverter to a second logic level at an output of the second inverter. Each buffer circuit further includes a current limiting circuit that is coupled between the first and second inverters to limit the standby current in the buffer. The memory device further includes: a control circuit that receives control signals from the electronic system through the buffer circuits to control the operation of the memory device; an array of cells that store data for the electronic system; and an addressing circuit that receives address signals from the electronic system that identify a cell in the array of cells to be accessed by the electronic system.

DETAILED DESCRIPTION OF THE INVENTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1A:
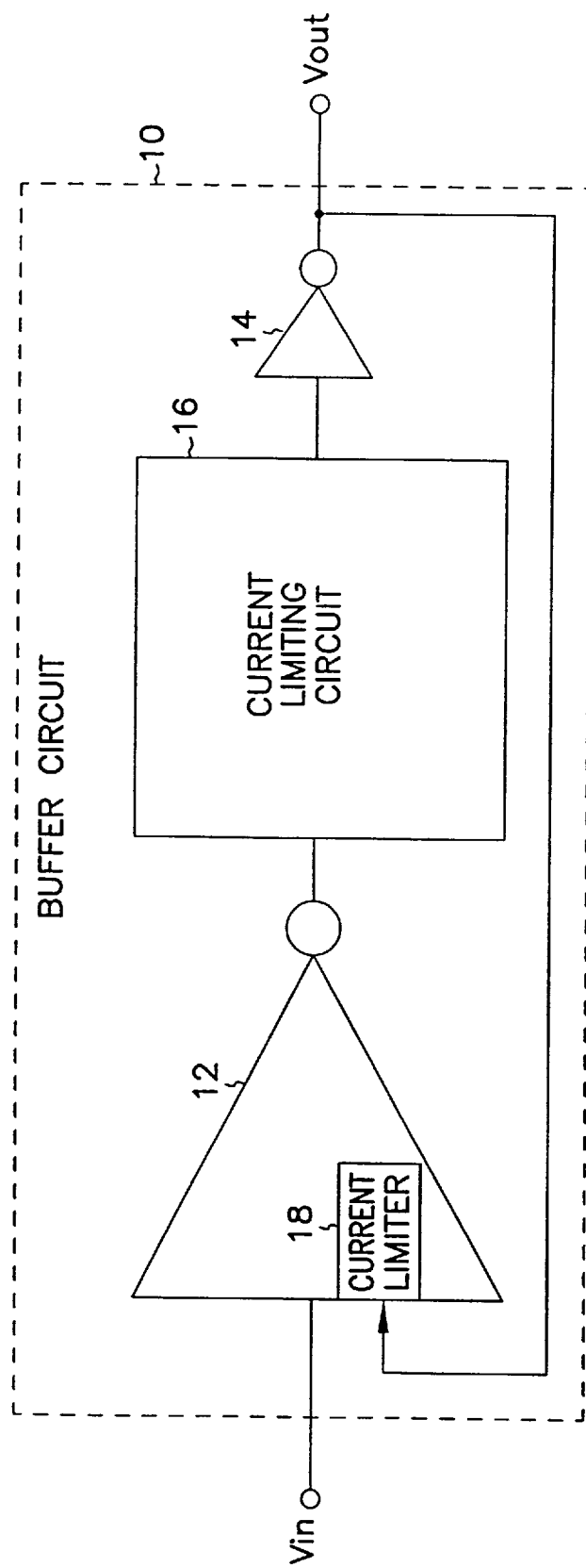
FIGS. 1A and 1B are block diagrams of illustrative embodiments of the present invention.

FIG. 1A is a block diagram of an illustrative embodiment of the present invention. Buffer circuit 10 converts the logic level of an input signal with a lower standby current than conventional buffer circuits. Buffer circuit 10 includes first and second inverters 12 and 14, respectively, and current limiting circuit 16. First inverter 12 receives an input signal, $V_{in}$. An output of inverter 12 is coupled to current limiting circuit 16. Current limiting circuit 16 is coupled to an input of second inverter 14. The output of second inverter 14 is coupled to current limiter 18 of first inverter 12 through a feedback control input.

In operation, buffer 10 converts the logic level of the $V_{in}$ signal. For example, in one embodiment, buffer circuit 10 converts an input signal from a transistor-transistor logic (TTL) circuit to a corresponding signal used in devices using a complimentary metal-oxide-semiconductor (CMOS) design.

To convert a low TTL logic level to a corresponding CMOS logic level, first inverter 12 receives the low TTL signal and produces an output that is approximately equal to the supply voltage. Current limiter 18 of inverter 12 limits the standby current caused by the 0.7 to 0.8 voltage of $V_{in}$ in first inverter 12. Second inverter 14 inverts the high CMOS logic level from first inverter 12 to produce a low logic output that is approximately at ground potential. Current limiter 18 uses this low CMOS logic level to limit the current in first inverter 12. Current limiting circuit 16 further limits the standby current of buffer circuit 10 by establishing a low current on the order of 2 to 5 microamps through conductive components of buffer circuit 10 at both high and low logic levels.

Figure 1B:
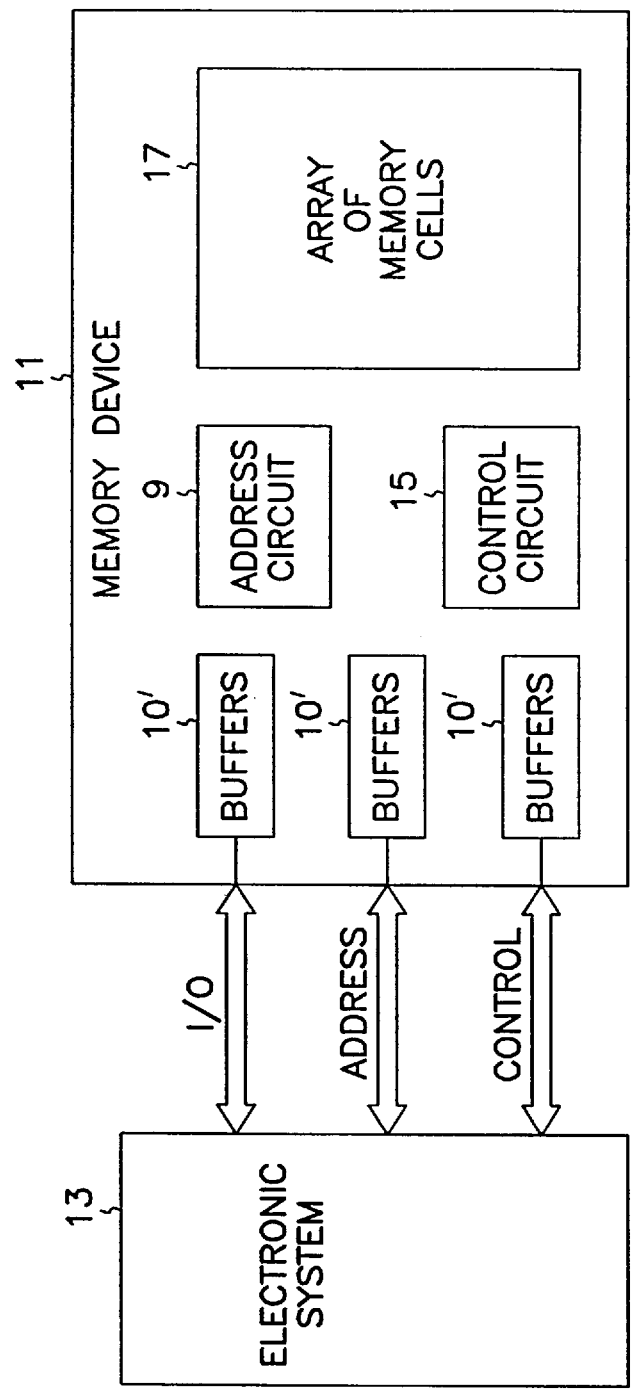

FIG. 1B is a block diagram of a dynamic random access memory device 11 that includes a number of buffer circuits 10' for use with an electronic system 13. A number of buffer circuits 10' may be constructed as shown and described with respect to FIG. 1A so as to limit the standby current used by memory device 11.

Electronic system 13 communicates with memory device 11 through input/output (I/O) lines, address lines and control lines. Electronic system 13 comprises, for example, a computer or other appropriate system that interfaces with a memory device. Buffer circuits 10' are coupled to the input/output lines, the address lines and the control lines as needed to convert logic levels of signals. Memory device 11 comprises, for example, a dynamic random access memory. Memory device 11 further includes control circuit 15, addressing circuit 9 and array of memory cells 17 that are constructed as known to a person of ordinary skill in the art.

In operation, buffers 10' convert logic levels of signals from electronic system 13 for use by memory device 11 with reduced standby current. Electronic system 13 produces address, control and input signals using, for example, TTL logic levels. Buffers 10' convert the logic levels, for example, to CMOS levels for control circuit 15 and addressing circuit 9 so as to store or retrieve data from array of memory cells 17.

Figure 2A:
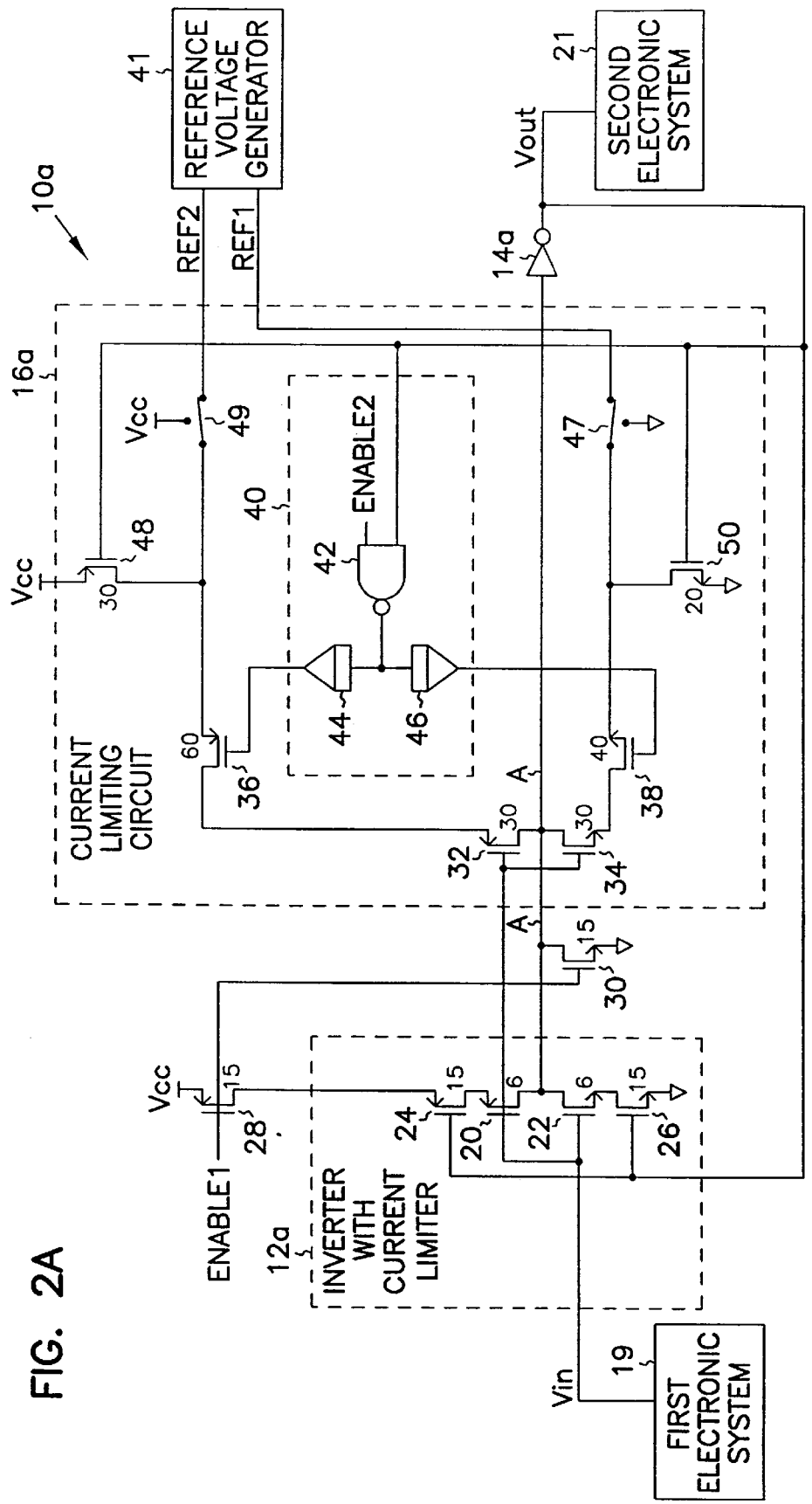
FIGS. 2A and 2B are schematic diagrams of another embodiment of the present invention.

FIG. 2A is a schematic diagram of another illustrative embodiment of the present invention. Buffer circuit 10a includes first inverter 12a, current limiting circuit 16a, and second inverter 14a.

First inverter 12a includes p-channel transistor 20 and n-channel transistor 22 coupled to form an inverter. An input voltage, $V_{in}$, is coupled to a gate of each transistor 20 and 22. A drain of transistor 20 is coupled to a drain of transistor 22 to provide an output for inverter 12a. Further, inverter 12a includes p-channel transistor 24 and n-channel transistor 26.

Transistors 24 and 26 limit the standby current in inverter 12a. Transistors 24 and 26 each have a gate. The gates of transistors 24 and 26 are coupled to receive the output of second inverter 14a as a feedback control signal. A drain of transistor 26 is coupled to a source of transistor 22. A source of transistor 26 is coupled to ground. Similarly, a drain of transistor 24 is coupled to a source of transistor 20 and a source of transistor 24 is coupled through a p-channel enable transistor 28 to a voltage supply, $V_{cc}$. Transistors 24 and 26 limit the standby current by eliminating current paths in response to low and high logic levels for $V_{in}$. For example, when $V_{in}$ is a low logic level, second inverter 14a outputs approximately zero volts which provides approximately zero volts from the gate to the source of transistor 26. This eliminates transistor 26 as a standby current path. Similarly, when $V_{in}$ is high, the output of second inverter 14a prevents transistor 24 from conducting a significant amount of current.

Enable transistor 28 receives a signal, ENABLE1, that places buffer circuit 10a in active-standby mode when ENABLE1 is a low logic level. A gate of enable transistor 28 is coupled to ENABLE1. A source of enable transistor 28 is coupled to $V_{cc}$ and a drain of enable transistor 28 is coupled to the source of transistor 24. A second enable transistor 30 includes a gate that is coupled to receive the ENABLE1 control signal. Further, a source of transistor 30 is coupled to ground and a drain of transistor 30 is coupled to the output of inverter 12 at node A.

Current limiting circuit 16a includes p-channel transistor 32 and 34 that are placed in standby current paths for buffer circuit 10a to limit the standby current. The gates of transistors 32 and 34 are coupled to receive the input signal, $V_{in}$. The drains of transistors 32 and 34 are coupled together at node A. Further, the drains of transistors 32 and 34 are coupled to the drains of pass gate transistors 36 and 38, respectively.

Pass gate transistors 36 and 38 are controlled by a logic circuit 40 that has outputs coupled to the gates of transistors 36 and 38. Specifically, logic circuit 40 comprises NAND-gate 42 and first and second delay circuits 44 and 46. NAND-gate 42 receives an enable signal, ENABLE 2, at a first input and a feedback control signal at a second input. As shown, the feedback control signal comprises the output from second inverter 14a. Other signals in buffer circuit 10a can be used in place of the output of second inverter 14a with proper modification of logic circuit 40. The output of NAND-gate 42 is coupled to delay circuits 44 and 46. Delay circuit 44 provides a control signal to the gate of transistor 36 and delays only signals from NAND-gate 42 on a positive going signal. Finally, delay circuit 46 is coupled to the gate of transistor 38 and delays only signals from NAND-gate 42 on a negative going signal.

Current limiting circuit 16a uses two reference voltages to control the standby current of buffer circuit 10a. The first reference voltage, REF1, is coupled to a source of pass gate transistor 38 through switch 47. The second reference voltage, REF2, is coupled to a source of pass gate transistor 36 through a switch 49. Voltages REF1 and REF2 are provided by reference voltage generator 41. When switches 47 and 49 couple voltages REF1 and REF2 to transistors 38 and 36, respectively, buffer circuit 10a operates with low standby current. When switches 47 and 49 couple voltages $V_{cc}$ and ground to transistors 38 and 36, respectively, buffer circuit 10a operates more conventionally, with higher standby current.

Transistors 50 and 48 selectively apply the reference voltages REF1 and REF2 to transistors 38 and 36, respectively. The gates of transistors 48 and 50 are controlled by a feedback signal from the output of second inverter 14a. Transistors 48 and 50 provide $V_{cc}$ and ground precharge levels for REF2 and REF1, respectively.

In operation, buffer circuit 10a converts a signal from first electronic system 19 to a corresponding logic level for second electronic system 21. In the example described herein, first electronic system 19 is a TTL circuit and second electronic system 21 is a CMOS system.

When $V_{in}$ goes from a low logic level to a high logic level, the inverter formed by transistors 20 and 22 begins to force the voltage at node A to decrease toward ground. Once the voltage at node A decreases past a threshold for inverter 14a, the output of inverter 14a increases to produce a CMOS high logic output that is approximately equal to $V_{cc}$. Thus, buffer circuit 10a converts the TTL high voltage of 2.0 volts to a CMOS logic high that is approximately equal to the power supply, e.g., 3.0 to 5.0 volts.

Buffer circuit 10a converts the voltage level with reduced standby current when compared to conventional buffers. The reduction in standby current is significant when compared to conventional buffers. Transistor 24 acts as a current limiter when $V_{in}$ comprises a high logic level. The feedback signal from inverter 14a provides a voltage to the gate of transistor 24 that is approximately equal to the power supply voltage. Thus, transistor 24 is turned "off" eliminating a standby current path. For purposes of this specification, the term "off" means that the transistor conducts an insignificant amount of current from drain to source. Conversely, the term "on" refers to a transistor that conducts more than an insignificant amount of current from drain to source. The feedback signal also turns on transistor 26 producing a current path for standby current.

Transistor 32 controls the level of standby current that is conducted by transistor 26 in response to a high logic input from first electronic system 19. When the output of inverter 14a goes to a CMOS high logic level, approximately equal to the supply voltage, transistor 48 is turned off and transistor 50 is turned on. Transistor 48 thus couples the voltage REF2 to transistor 36 and transistor 50 couples transistor 38 to ground. By coupling the source of transistor 38 to ground, current limiting circuit 16a "precharges" node A to a low logic level. Logic circuit 40 turns on pass gate transistor 36 and, after a delay, turns off transistor 38 to insure stability of buffer circuit 10a. Pass gate transistor 36 passes the REF2 voltage to the source of transistor 32. The value of the REF2 voltage is selected to set the current through transistor 32. For example, the REF2 voltage may exceed the high logic input of $V_{in}$ by approximately the threshold voltage of p-channel transistor 36. Thus, the gate to source voltage of transistor 32 is low and a low standby current is established in the current path including transistors 36, 32, 22, and 26.

In a similar manner, transistor 34 controls the level of standby current that is conducted by buffer circuit 10a in response to a low logic input from first electronic system 19. When the output of inverter 14a goes to a CMOS low logic level approximately equal to ground potential, transistor 48 is turned on and transistor 50 is turned off. Transistor 48 thus couples transistor 36 to $V_{cc}$ and transistor 50 couples transistor 38 to REF1. By coupling the source of transistor 36 to $V_{cc}$, current limiting circuit 16a "precharges" node A to a high logic level. Logic circuit 40 turns on pass-gate transistor 38 and, after a delay, turns off pass-gate transistor 36. Pass gate transistor 38 passes the REF1 voltage to the source of transistor 34. By selecting the REF1 voltage, the current through transistor 34 is set. For example, the REF1 voltage may be set to substantially equal to the low logic value of $V_{in}$. Thus, the gate to source voltage of transistor 32 is low and a low standby current is established in the current path including transistors 28, 24, 20, 34, and 38.

It is noted that in the description above, REF2 establishes a gate to source voltage for transistor 32 when $V_{in}$ is high that is different from the gate to source voltage established by REF1 on transistor 34 when $V_{in}$ is low. In the exemplary embodiment, the REF2 voltage sets the gate to source voltage of transistor 32 to a value of approximately 0.7 to 0.8 volts whereas the REF1 voltage sets the gate to source voltage of transistor 34 to approximately zero volts. This difference in gate to source voltage does not unduly hinder the operation of buffer circuit 10a. In the present embodiment, the difference in gate to source voltages is selected so as to limit the swing in voltage required at the source of transistor 32 when $V_{in}$ goes to a high TTL logic value. The TTL logic levels are not symmetric with respect to the corresponding CMOS high and low logic values. By using the specified REF1 and REF2 voltages, buffer circuit 10a maintains acceptable speed while also improving the standby current. In other embodiments, the gate to source voltages used for transistors 32 and 34 to limit the standby current of the buffer circuit may both be set at other levels depending on, for example, the nature of the input voltage, $V_{in}$, the speed requirements for the buffer circuit, and the acceptable level of standby current.

Delay circuits 44 and 46 in logic circuit 40 improve the stability of buffer circuit 10a by reducing oscillation in the voltage at node A during transitions in the voltage from system 19. For example, delay circuit 46 delays turning off transistor 38 when the output of system 19 goes from a low logic level to a high logic level. Thus, transistor 38 provides a low voltage to the source of transistor 34 to keep transistor 34 on and produce a low voltage at node A. If transistor 38 were turned off without a delay, transistor 32 could try to pull node A to a higher logic level thus producing an oscillation in the output. Similarly, delay circuit 44 aids in preventing oscillation when the input from system 19 goes from a low logic level to a high logic level.

Figure 2B:
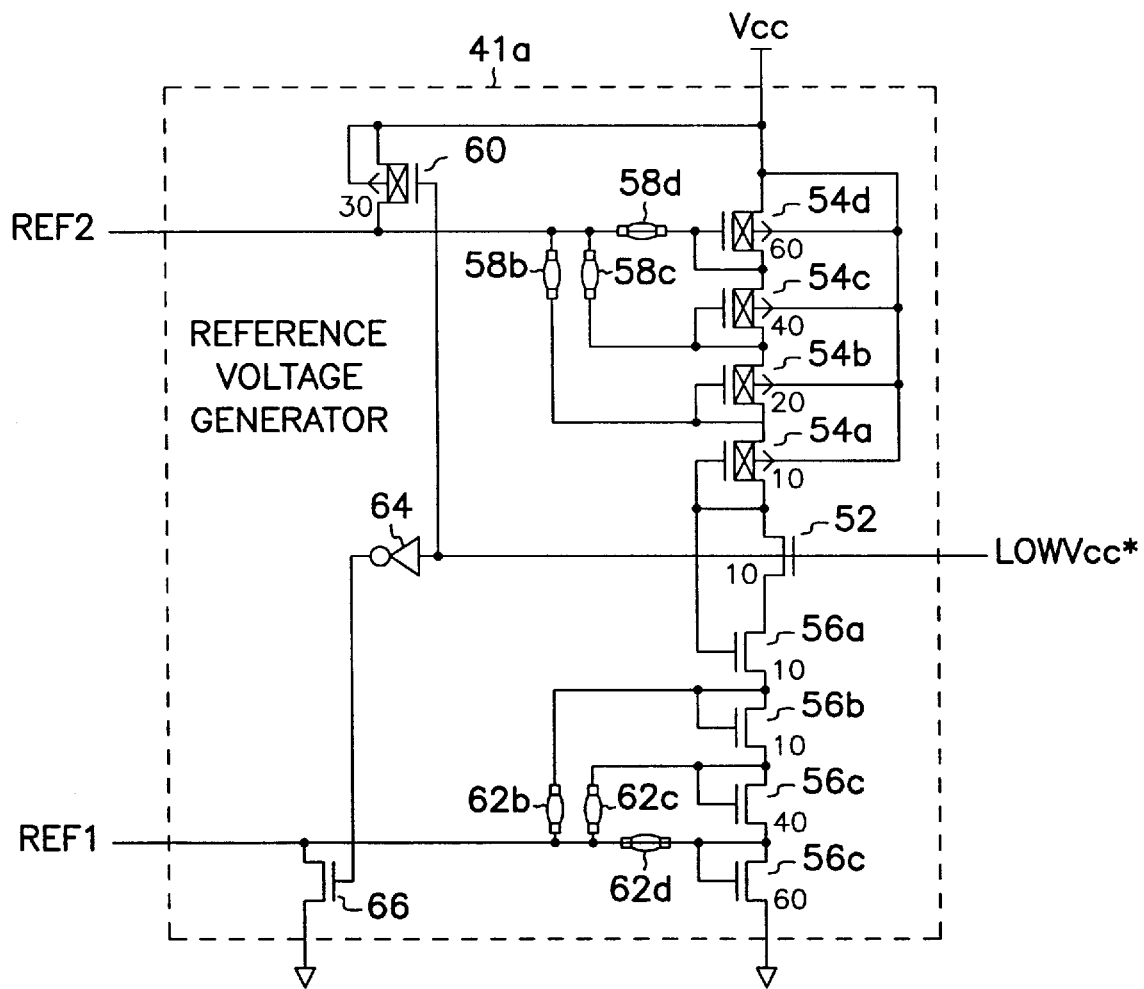

FIG. 2B is a schematic diagram of a reference voltage generator indicated generally at 41a for use in buffer circuit 10a of FIG. 2A. Generator 41a includes n-channel transistor 52 with a gate that is coupled to a control signal, LOWVCC*. The control signal LOWVCC* establishes one of two modes of operation for reference voltage generator 41a.

Four diode coupled p-channel transistors 54a through 54d are coupled in series from a drain of transistor 52. Further, the substrate of each transistor 54a through 54d is coupled to the supply voltage. Four n-channel diode coupled transistors 56a through 56d are coupled in series between the source of transistor 52 and ground. The gates of transistors 54b through 54d are coupled through switches 58b through 58d, respectively, to the REF2 node. Similarly, the gates of transistors 56b through 56d are coupled through switches 62b through 62d to the REF1 node.

Transistors 60 and 66 establish the mode of operation for generator 41a. Transistor 60 has a drain that is coupled to the REF2 node. The gate of transistor 60 is coupled to LOWVCC* and the source of transistor 60 is coupled to the supply voltage, $V_{cc}$. Transistor 66 has a gate that is coupled to receive the inverted LOWVCC* signal from inverter 64. The source of transistor 66 is coupled to ground and the drain of transistor 66 is coupled to the REF1 node.

In operation, generator 41a generates two reference voltages for current limiting circuit 16a of FIG. 2A. The LOWVCC* control signal places reference voltage generator 41a in one of two modes of operation. First, when $V_{cc}$ is above a threshold, LOWVCC* produces a voltage that turns on transistors 60 and 66. Thus, REF2 is approximately equal to $V_{cc}$ and REF1 is approximately at ground potential. Further, when $V_{cc}$ is above the threshold, LOWVCC* produces a voltage that turns off both transistors 60 and 66 so that the voltage established by transistors 54a through 54d produces the voltage for REF2 and transistors 56a through 56d produce the voltage for REF1.

When $V_{cc}$ is above the threshold, LOWVCC* establishes a current through transistors 54a through 54d and transistors 56a through 56d. This establishes potential reference voltages for REF2 and REF1 at the gates of transistors 54b through 54d and transistors 56b through 56d, respectively. To select the voltage at the gate of transistor 54d, switch 58d is closed and switches 58b and 58c are opened. Thus REF2 is approximately one diode drop below the power supply. In other embodiments, switches 58b and 58c can be used to establish different voltages for REF2. Similarly, switches 62b through 62d establish the voltage for REF1 to be a selected number of diode drops above ground potential.

CONCLUSION

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. For example, buffer circuit 10 can be modified to convert logic levels other than from TTL to CMOS. Further, other values may be used for REF1 and REF2 to meet specific standby current levels. Further, REF1 and REF2 can be modified to meet changes in supply voltage, logic levels and other parameters of the buffer circuit. Other reference voltage generators may be used; even reference voltage generators that do not provide switchable voltage levels as shown in FIG. 2B.

The embodiments shown in FIGS. 2A and 2B include exemplary sizing for the various transistors. Next to each transistor, the width to length for the transistor in the exemplary embodiment. It is noted that the size of these transistors is shown by way of example and not by way of limitation. The sizes can be varied to meet requirements for a specific electronic system.

What is claimed is:

1. A method for converting a signal between first and second logic families with reduced standby current, the method comprising:

inverting an input signal of a first logic family with a first inverter;

inverting the output of the first invertor with a second inverter so as to produce an output signal with a logic level of the second logic family;

feeding the output of the second inverter back to current limiting transistors of the first inverter to limit the standby current of the first inverter; and selectively applying reference voltages to transistors coupled to the output of the first inverter and to the input of the second inverter in a standby current path based on the output of the second inverter so as to further limit the standby current.

2. The method of claim 1, and further comprising precharging the input of the second inverter based on the output of the second inverter when the input to the first inverter changes logic levels.

3. The method of claim 1, wherein feeding the output of the second inverter back comprises feeding the output of the second inverter back to the gates of first and second current limiting transistors such that the first transistor limits the standby current for a high logic output from the second inverter and the second transistor limits the standby current for a low logic output from the second inverter.

4. The method of claim 1, wherein selectively applying reference voltages comprises selectively applying a voltage that creates a low gate to source voltage on a transistor in a standby current path so as to limit the standby current.

5. A buffer circuit, comprising:

a first inverter with a first current limiter that limits the standby current used by the first inverter;

a second inverter coupled to an output of the first inverter so as to convert a first logic level of an input signal provided to the first inverter to a second logic level at an output of the second inverter;

a second current limiting circuit coupled to the output of the first inverter and to the input of the second inverter to further limit the standby current in the buffer; and wherein the first and second current limiting circuits are controlled by a feedback signal from the output of the second inverter.

6. The buffer circuit of claim 5, wherein the second current limiting circuit comprises first and second transistors in standby current paths for low and high logic inputs to the buffer, respectively.

7. The buffer circuit of claim 6, and further comprising a reference voltage source that couples a reference voltage to either the first or second transistors in the standby current path so as to establish a low gate to source voltage for the transistor.

8. A buffer that converts a signal between first and second logic families with reduced standby current, the buffer comprising:

first means for inverting an input signal of a first logic family;

second means for inverting the output of the first means for inverting so as to produce an output signal with a logic level of the second logic family;

means for feeding the output of the second means for inverting back to current limiting circuits of the first means for inverting to limit the standby current; and means for selectively applying reference voltages to transistors coupled to the output of the means for inverting and to the input of the second means for inverting in a standby current path based on the output of the second means for inverting so as to further limit the standby current.

9. The buffer of claim 8, and further comprising means for precharging the input of the second inverter based on the output of the second inverter when the input to the first inverter changes logic levels.

10. The buffer of claim 8, wherein the first means for inverting comprises a complimentary metal-oxide semiconductor (CMOS) inverter.

11. A buffer circuit, comprising:
- a first inverter with a first current limiter that limits the standby current used by the first inverter;
- a second inverter coupled to an output of the first inverter so as to convert a first logic level of an input signal provided to the first inverter to a second logic level at an output of the second inverter;
- a second current limiting circuit coupled to the output of the first inverter and to the input of the second inverter to further limit the standby current in the buffer;
- a precharge circuit coupled between the output of the second inverter and the input to the second inverter that precharges the input to the second inverter based on the output of the second inverter; and
- wherein the first and second current limiting circuits are controlled by a feedback signal from the output of the second inverter.

12. The buffer circuit of claim 11, wherein the second current limiting circuit comprises first and second transistors in standby current paths for low and high logic inputs to the buffer, respectively.

13. The buffer circuit of claim 12, and further comprising a reference voltage source that couples a reference voltage to either the first or second transistors in the standby current path so as to establish a low gate to source voltage for the transistor.

* * * * *